United States Patent
Kishimoto et al.

(10) Patent No.: US 6,893,530 B2
(45) Date of Patent: May 17, 2005

(54) METHOD AND SYSTEM OF DRYING MATERIALS AND METHOD OF MANUFACTURING CIRCUIT BOARDS USING THE SAME

(75) Inventors: Kunio Kishimoto, Osaka (JP); Toshihiro Nishii, Osaka (JP); Toshiaki Takenaka, Kyoto (JP); Shinji Nakamura, Osaka (JP); Akihiro Miura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 279 days.

(21) Appl. No.: 10/068,025

(22) Filed: Feb. 8, 2002

(65) Prior Publication Data
US 2002/0173109 A1 Nov. 21, 2002

Related U.S. Application Data

(63) Continuation-in-part of application No. PCT/JP01/04819, filed on Jun. 7, 2001.

(30) Foreign Application Priority Data
Jun. 8, 2000 (JP) ........................................ 2000-171539

(51) Int. Cl.⁷ .................................................. F26B 3/00
(52) U.S. Cl. ........................................ 156/285; 156/312
(58) Field of Search ................................ 156/285, 286, 156/312, 381, 382; 34/92, 242

(56) References Cited

U.S. PATENT DOCUMENTS 4,893,415 A * 1/1990 Moldrup ...................... 34/406
5,732,478 A * 3/1998 Chapman et al. ............. 34/629

FOREIGN PATENT DOCUMENTS

| CN | 2286521 Y | 7/1998 |
|----|-----------|--------|
| EP | 0455465 A2 | 11/1991 |
| EP | 0977471 A1 | 2/2000 |
| JP | 61-55372 | 4/1986 |
| JP | 04-097845 | 3/1992 |
| JP | 6-268345 | 9/1994 |
| JP | 7-243765 | 9/1995 |
| JP | 10-2665 | 1/1998 |
| JP | 11-43384 | 2/1999 |
| JP | 2000-36666 | 2/2000 |

* cited by examiner

*Primary Examiner*—John T. Haran
(74) *Attorney, Agent, or Firm*—McDermott Will & Emery LLP

(57) ABSTRACT

A method and system of cleaning to remove cutting dust and the like generated and adhering to a board material (1a) during drilling for electrical connection, and drying the board material, in a process of manufacturing a circuit board for small electronic equipment and the like. A large amount of board materials can be treated without receiving thermal damage by performing the steps of: placing sheets of the board material that have absorbed moisture resulting from cleaning, like a stack in a vacuum chamber (11); and drying the board material by repeating evacuation and pressurization under predetermined conditions while heating the board material.

23 Claims, 4 Drawing Sheets

METHOD AND SYSTEM OF DRYING MATERIALS AND METHOD OF MANUFACTURING CIRCUIT BOARDS USING THE SAME

This application claims priority from and is a continuation in part of International Application No. PCT/JP01/04819, filed Jun. 7, 2001 and Japanese Patent Application No. 2000-171539, filed Jun. 8, 2000.

FIELD OF THE INVENTION

The present invention relates to a method and system of drying materials and a method of manufacturing circuit boards using the same.

BACKGROUND OF THE INVENTION

With recent downsizing and high density of electronic equipment, a double-sided or multi-layered circuit board is employed more frequently than a conventional single-sided board, as a circuit board on which electronic components are mounted, and a high density circuit board allowing a larger number of circuits to be integrated in a circuit board is developed.

For the high density circuit board, instead of drilling of holes (through holes) in the board, which is conventionally operated, employment of laser machining capable of faster and more fine machining is developed (Y. Yamanaka et al. "Excimer Laser Processing In The Microelectronics Fields", for example). Also proposed is a circuit board in which layers are connected using fine holes made by laser and such connection means as conductive paste (shown in Japanese Patent Application Non-examined Publication No. H06-268345, for example).

In the technique of making fine holes and connecting layers using conductive paste, a few foreign substances may cause contact failure.

In this technique, the substrate material is drilled together with a film bonded thereto and the film is used as a mask for filling the conductive paste into the fine holes. Therefore, all the substrate material including the film must be kept clean.

However, both drilling and laser machining produce a large amount of dust and debris from the cutting process, and this dust and debris may adhere to the board material and close the holes for electrical connection. In addition, it is also possible that a little dust in air may close the fine holes. To solve this problem, the board material is cleaned before the conductive paste is filled in the holes. However, because complete cleaning of the holes by a dry cleaning method is very difficult, such new wet cleaning methods as ultrasonic cleaning are employed. These methods require drying after cleaning, in order to remove the moisture absorbed from the periphery of the machined holes or the outer ends of the board material.

As shown in FIG. 4(a), mask films 2a and 2b are bonded to substrate material 1. Provided at an end of substrate material 1 are peel off leading parts 3a and 3b for stripping mask films 2a and 2b after the conductive paste is filled. The leading parts 3a and 3b are made by stripping a part of each of mask films 2a and 2b.

Because of such a structure, when sheets of substrate material 1 are stacked one on top of another and dried by heating using a conventional hot air convection method as shown in FIG. 4(b), B-stage epoxy resin in the board material melts and stripping leading parts 43a and 43b and substrate material 1 melt together again, as shown in FIG. 4(c). Therefore, it is difficult to treat and sufficiently dry a large number of sheets at a time.

A small number of sheets could be treated with a vacuum dryer. However, it takes long time to dry a large number of sheets because sufficient latent heat cannot be given to the material under vacuum and thus energy sufficient to remove the moisture cannot be added.

In improving reliability of connection in circuit boards, wet cleaning is more effective than dry cleaning. However, insufficient drying after cleaning would significantly affect the reliability of connection and insulation.

For this reason, moisture must be removed completely. However, the conventional method is not efficient and may possess problems e.g. causing more damage to the board material.

The present invention is directed to realize a board material having high-quality fine holes and to provide a method and a system of manufacturing highly reliable circuit boards at low cost.

DISCLOSURE OF THE INVENTION

In order to address the above-mentioned problems, a method of manufacturing circuit boards in accordance with the present invention includes a bonding step of bonding a film-like material to at least one side of a board material to form a substrate material having a film(s). The method of manufacturing circuit boards also includes: a hole-forming step of drilling a through or a blind hole in the board material made of a plurality of materials; and a step of forming a connection means in the through or blind hole for mutually connecting circuits formed on or in the circuit board. The hole-forming step includes: a step of irradiating the board material with laser to form a through or blind hole shape; and a step of cleaning to remove foreign substances that have attached to the surface of the board material and the inner wall of the through or blind hole in the previous step. The method can provide a clean and highly reliable board material by efficiently drying the moisture absorbed by the board material, without damaging the board material, after the removal of water drops that have adhered to the surface of the board material in a cleaning process.

Therefore, in accordance with the present invention, high-quality drilling can be achieved without losing high speed of the laser machining, and a highly reliable circuit board can be provided at low cost.

DESCRIPTION OF THE PREFERRED EMBODIMENTS

Figure 1:
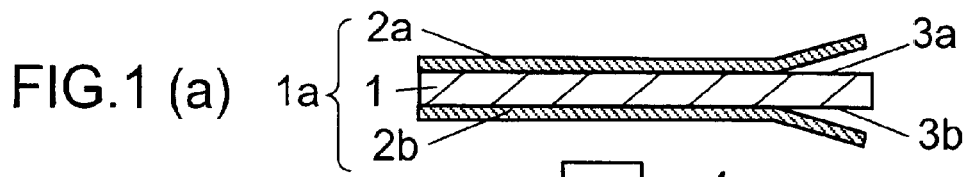
FIGS. 1(a)–1(h) are cross sectional views showing a process of a method of manufacturing a circuit board in accordance with an exemplary embodiment of the present invention.
Figure 1:
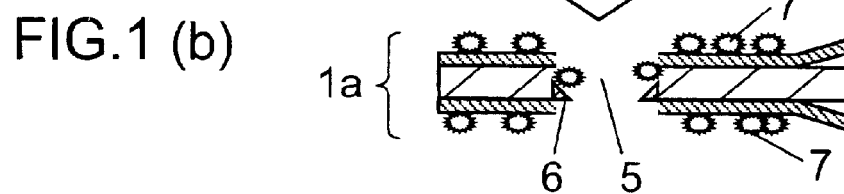
Figure 1:
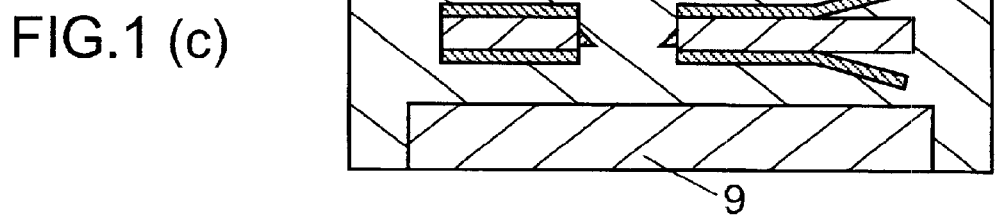
Figure 1:
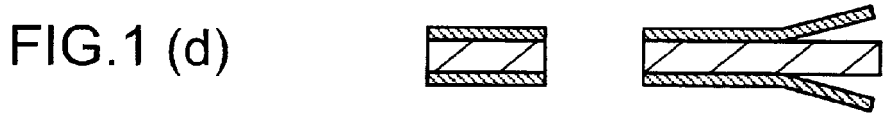
Figure 1:
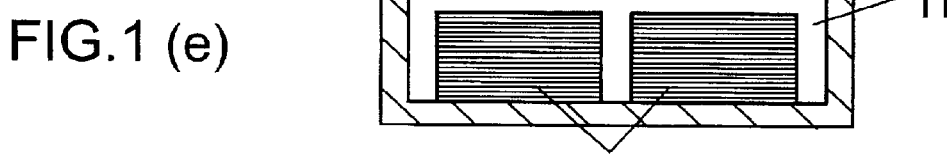
Figure 1:
Figure 1:
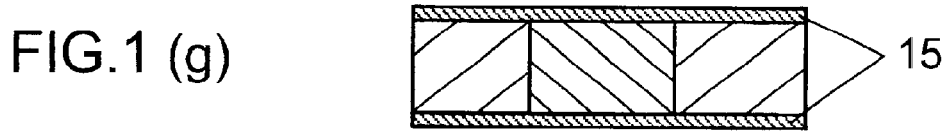
Figure 1:
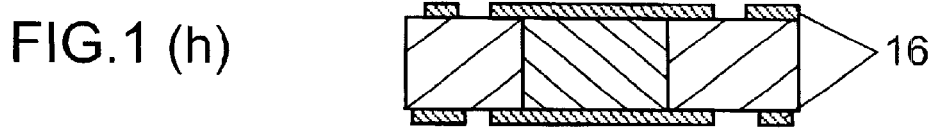

An exemplary embodiment of the present invention is hereinafter described with reference to FIGS. 1 to 3.

FIGS. 1(a) to 1(h) show cross sectional views of a process of a method of manufacturing a multi-layered circuit board in accordance with the present embodiment.

In FIGS. 1(a)–1(h), reference numeral 1 shows a substrate material that is a square plate of 250 mm on each side and approx. 150 μm thick, as an insulating substrate. Used as the substrate material is a resin impregnated substrate made of a composite material in which an non-woven fabric made of an aromatic polyamide fiber (hereinafter referred to as "aramid fiber") is impregnated with a thermosetting epoxy resin (hereinafter referred to as "epoxy resin"), for example. The epoxy resin in accordance with the present embodiment is a so-called "B stage" epoxy resin that contains an uncured portion.

Reference numerals 2a and 2b show strippable resin films for masking films, each of which is approx. 20 μm thick. On their surfaces that are to adhere to substrate material 1, thermosetting epoxy resin layers (not shown) of approx. 1 μm thick each are applied. Polyethylene terephthalate (hereinafter referred to as "PET sheet") is used as the strippable resin film, for example. Board material 1a is made by bonding PET sheets 2a and 2b to substrate material 1.

At one end of board material 1a, peel off leading parts 3a and 3b are previously provided between substrate material 1 and PET sheets 2a and 2b so as to peel off PET sheets 2a and 2b afterwards. The peel off leading parts 3a and 3b are made by stripping off a part of each PET sheet from substrate material 1.

Next, as shown in FIG. 1(b), substrate 1a is irradiated with laser light 4 to form through hole 5. At this time, part of the thermosetting epoxy resin and aramid fiber in board material 1a is sublimed by heat, and scatters to its surroundings. However, the thermosetting epoxy resin and aramid fiber that have not been sublimed remain on the wall surface of the hole, as hard and brittle altered portions 6.

Because the aramid fiber is more heat-resistant than the thermosetting epoxy resin and thus has a lower laser-machining rate, the aramid fiber is likely to remain without subliming. Therefore, the inner wall of the hole has rough surfaces as shown in the drawing.

On the other hand, part of the thermosetting epoxy resin or aramid fiber that has scattered to its surroundings adheres to the surface of board material 1a or the inside of through hole 5 as cutting dust 7.

Next, as shown in FIG. 1(c), board material 1a is placed near ultrasonic vibrator 9 and vibrated in, for example, water in the ultrasonic cleaning vessel 8. The acoustic energy radiated from ultrasonic vibrator 9 vibrates board material 1a and altered parts 6 and cutting dusts 7 fall out or are peeled off from board material 1a. As a result, board material 1b having a proper hole shape as shown in FIG. 1(d) is obtained. Additionally, water drops adhering to the surface of board material 1b are removed by blowing air therethrough or the like.

However, at the end of the air blowing process, in through hole 5 and peel off leading parts 3a and 3b of board material 1b, some moisture absorbed therein may still remain.

Next, as shown in FIG. 1(e), two sets 10 of 180 sheets of board material 1b stacked are prepared and placed in vacuum chamber 11, and board material 1b is dried.

Figure 2:
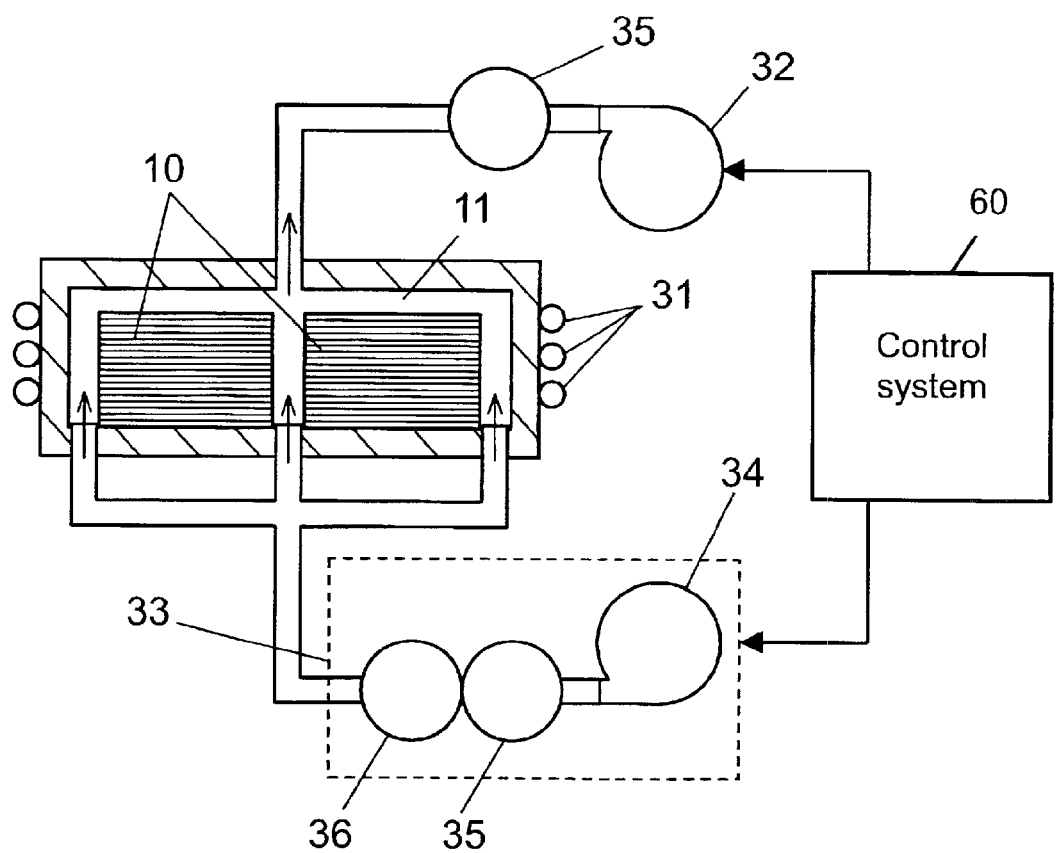
FIG. 2 is a schematic diagram of a circuit board manufacturing system in accordance with the embodiment.

FIG. 2 shows a schematic diagram of a dryer in accordance with the present invention. Pre-heater 31 are provided around vacuum chamber 11, and a vacuum system comprising a vacuum pump 32, and foreign substance removing filter 35 for protecting vacuum pump 32 is connected to the chamber.

In addition, the dryer has hot air supplier 33 comprising hot air generator 34, foreign substance removing filter 35, and air dryer 36 for pressurizing the chamber.

In one variation, control system 60, which is a programmable microcontroller based system, can be utilized to automatically control the operation of the pre-heater 31, the vacuum pump 32 and the hot air supplier 33.

Board material 1b placed in vacuum chamber 11 is evacuated and dried while being heated by radiation heat radiated from pre-heater 31.

In one variation, instead of using pre-heater 31, microwaves can be used for drying.

Figure 3:
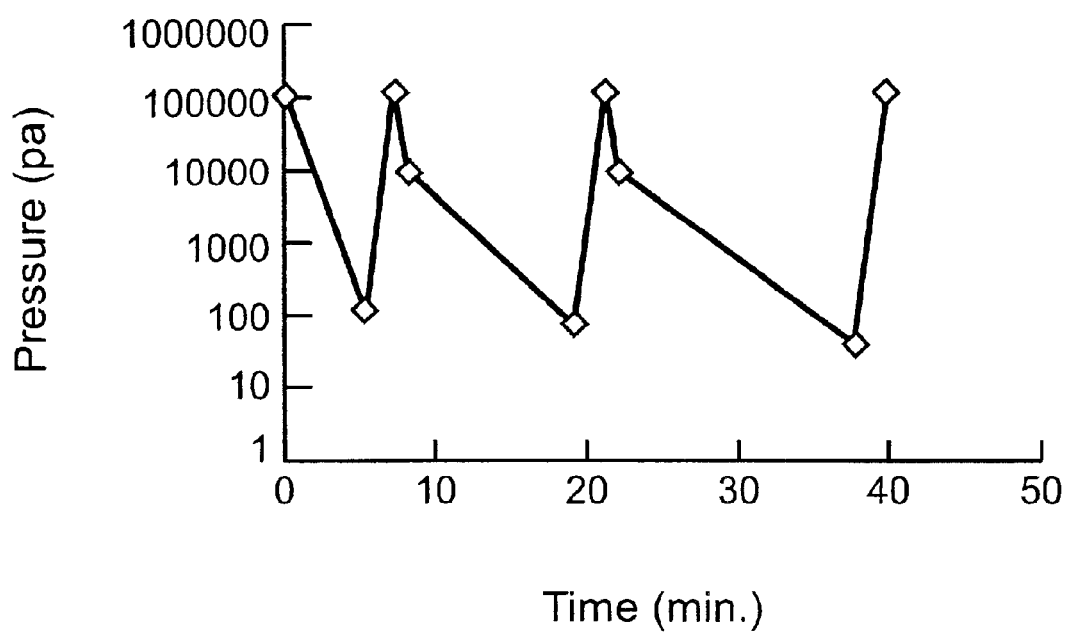
FIG. 3 is a graph showing a profile of pressures in a vacuum chamber for use with a material drying method in accordance with the present invention.
Figure 4:
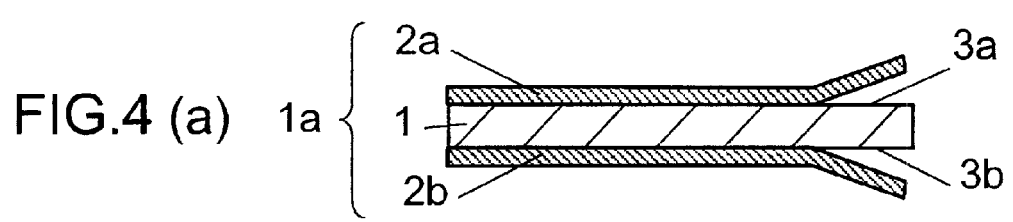
FIGS. 4(a)–4(c) are cross sectional views showing a process of a conventional method of manufacturing a circuit board.
Figure 4:
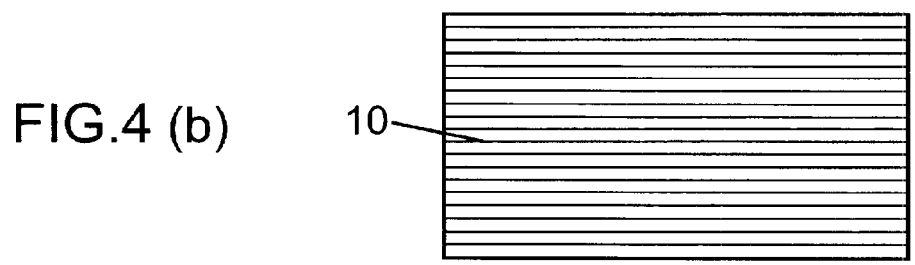
Figure 4:
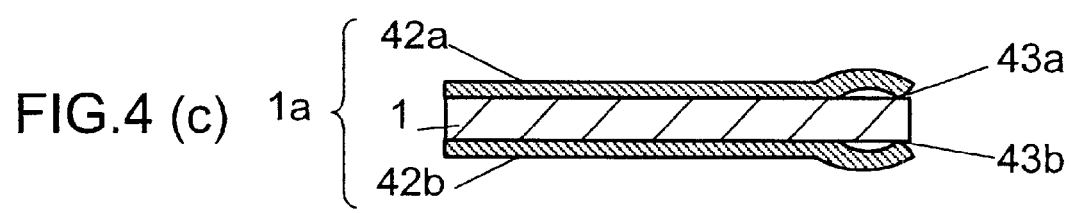

Next, an exemplary operation system of vacuum drying is described using FIG. 3.

(1) After placement of the board material, the vacuum pump is actuated to evacuate the chamber to a pressure of approx. 100 Pa.

(2) Next, the evacuation operation is stopped.

(3) Hot air supplier 33 supplies dry air at a temperature of approx. 60° C. that has been filtered through an air cleaner to vacuum chamber 11 and the chamber is pressurized to atmospheric pressure.

(4) After pressurizing, dry air is continuously supplied, and air in vacuum chamber 11 is circulated. Simultaneously evacuation using vacuum pump 32 makes air circulation efficient.

(5) Dry air is circulated for approx. one minute after the pressurization. Then the supply of dry air is stopped and the chamber is evacuated to a pressure of approx. 70 Pa.

(6) The above-described steps (2), (3), and (4) are repeated.

(7) After dry air is circulated for one minute after the pressurization, dry air supply is stopped and the chamber is evacuated to a pressure of approx. 40 Pa.

(8) Next, the evacuation operation is stopped.

(9) After hot air supplier 33 supplies dry air at a temperature of approx. 60° C. that has been filtered through the air cleaner to vacuum chamber 11 and the chamber is pressurized to atmospheric pressure, board material 1b is taken out of vacuum chamber 11.

It is noted that further repetition of these steps will enhance the degree of vacuum and dryness of the board material. To obtain a required dryness, the number of repetitions, ultimate pressure, temperature of dry air can be optimized according to the material.

An example of optimized conditions and the corresponding results are shown below:

First evacuation: degree of vacuum: 500 Pa→After reaching the ultimate pressure, dry air is introduced and the chamber is pressurized (at atmospheric pressure kept for one minute).

Second evacuation: degree of vacuum: 300 Pa→After reaching the ultimate pressure, dry air is introduced and the chamber is pressurized (at an atmospheric pressure kept for one minute).

Third evacuation: degree of vacuum: 150 Pa→After reaching the ultimate pressure, dry air is introduced and the chamber is pressurized (at an atmospheric pressure kept for one minute).

Fourth evacuation: degree of vacuum: 150 Pa→After reaching the ultimate pressure, dry air is introduced and the chamber is pressurized (at an atmospheric pressure kept for one minute).

The above four evacuating and pressurizing processes are then continually repeated until eighteen evacuations have been performed.

Then, the nineteenth evacuation: degree of vacuum: 150 Pa→After reaching the ultimate pressure, dry air is introduced and the chamber is pressurized (at an atmospheric pressure kept for one minute).

Twentieth evacuation: degree of vacuum: 150 Pa→After reaching the ultimate pressure, dry air is introduced and the chamber is pressurized (at an atmospheric pressure kept for one minute).→Completion In the above processes: temperature of dry air: 60° C.

Total process time: approx. 40 minutes

Results of Dryness:

|  |  | Change in substrate weight | | |
| --- | --- | --- | --- | --- |
|  |  | Before cleaning | After cleaning | After drying in vacuum |
| Upper part of Pallet 1 | No. 1 | 38.33 | 38.64 (+0.31) | 38.28 (−0.05) |
|  | No. 2 | 38.45 | 38.73 (+0.28) | 38.39 (−0.06) |
| Middle part of Pallet 1 | No. 1 | 38.46 | 38.75 (+0.29) | 38.41 (−0.05) |
|  | No. 2 | 38.54 | 38.84 (+0.30) | 38.48 (−0.06) |
| Lower part of Pallet 1 | No. 1 | 38.26 | 38.49 (+0.23) | 38.16 (−0.10) |
|  | No. 2 | 38.27 | 38.56 (+0.29) | 38.17 (−0.10) |
| Upper part of Pallet 2 | No. 1 | 38.37 | 38.66 (+0.29) | 38.25 (−0.12) |
|  | No. 2 | 38.43 | 38.75 (+0.28) | 38.35 (−0.08) |
| Middle part of Pallet 2 | No. 1 | 38.17 | 38.52 (+0.35) | 38.14 (−0.03) |
|  | No. 2 | 38.37 | 38.71 (+0.34) | 38.29 (−0.08) |
| Lower part of Pallet 2 | No. 1 | 38.01 | 38.31 (+0.30) | 38.00 (−0.01) |
|  | No. 2 | 38.17 | 38.49 (+0.32) | 38.14 (−0.03) |

Measuring samples were placed in each of the upper, middle, and lower parts of the right and left pallets in the chamber and the weight of the materials before cleaning, after cleaning, and after drying was measured. The results show that the weight after drying under vacuum is less than that of before cleaning and moisture has sufficiently been removed.

Next, as shown in FIG. 1(f), conductive paste 14 is filled in through holes 5 using such means as printing. As through holes 5 have a proper shape, the inside of through holes 5 can completely be filled with conductive paste 14 without hindrance. After the filling, mask films made of PET sheets 2a and 2b are stripped off.

Next, as shown in FIG. 1(g), board material 1b is sandwiched by metal foils 15 and heated and pressed using a hot press (not shown). This operation completely cures board material 1b that has been in the pre-preg state and electrically connects metal foils 15 bonded to the both sides of board material 1b together via conductive paste 14.

Next, metallic foils 15 are patterned to a desired pattern and a double-sided circuit board that has circuit patterns 16 as shown in FIG. 1(h) is obtained.

The drying method in accordance with this embodiment can also be used for drying a double-sided circuit board that has been washed after the patterning.

In this embodiment, a double-sided circuit board is described. However, it is noted that the method can be applied to a multi-layered circuit board by repeating the steps in accordance with the present invention a plurality of times.

In the present invention, the case where conductive paste 14 is filled in through holes 5 in board material 1b is described. However, in the case where plated conductor is formed in through holes 5, the same effect can be obtained.

Industrial Applicability

As described above, a method and a system of manufacturing a circuit board in accordance with the present invention comprise the following steps. A step of irradiating a board material with laser to form a through or blind shaped holes. A step of obtaining a desired through or blind shaped holes by water cleaning and removing altered substances in the form of powder or blocks that have scattered from the board material and adhered during or after the laser irradiation step. The altered substances are formed on the surface of the board material and the inner wall of the through-holes or blind holes. Removing water drops that have attached to the surface of the board material in the cleaning step. Drying the board material by the gross to dry the moisture absorbed in the board material in the cleaning process, without causing thermal damage to the board material, by repeating evacuation and pressurization cycles while heating the board material. Thus, high-quality drilling can be achieved without losing quickness of laser machining, and highly reliable circuit boards can be obtained at low cost.

What is claimed is:

1. A method of drying a circuit board material comprising the steps of:

evacuating air in a vacuum chamber containing said material under an atmospheric pressure to a predefined pressure; and supplying air to said vacuum chamber to return the pressure in said chamber to the atmospheric pressure, wherein said evacuating and supplying steps are performed more than once, and the predefined pressure of a subsequent evacuating step is lower than the predefined pressure of the previous evacuating step.

2. The method of drying a circuit board material according to claim 1 further comprising the steps of:

supplying hot air into said chamber when said chamber is returned to the atmospheric pressure; and evacuating said chamber while said hot air is supplied to said vacuum chamber;

stopping the supply of said hot air after a predetermined time duration; and evacuating said chamber to said predefined pressure.

3. The method of drying a circuit board material according to claim 2, wherein said predetermined time duration is at least one second.

4. The method of drying a circuit board material according to claim 2, wherein the air pressure of said hot air of a subsequent evacuating step is lower than the air pressure of said hot air of the previous evacuating step.

5. The method of drying a circuit board material according to claim 2, wherein a temperature of said hot air is at least 35° C.

6. The method of drying a circuit board material according to claim 1, wherein said steps are performed while heating said material in said vacuum chamber.

7. The method of drying a circuit board material according to claim 6, wherein said material is heated by one of radiation heat from a heater and a heating by microwave.

8. The method of drying a circuit board material according to claim 6, wherein said material is heated using dielectric heating by microwaves.

9. The method of drying a circuit board material according to claim 1, wherein said supplying of air to said vacuum chamber is performed from a plurality of points.

10. The method of drying a circuit board material according to claim 1, wherein said evacuating of said vacuum chamber is performed from a plurality of points.

11. The method of drying a circuit board material according to claim 1, wherein said air to be supplied is dry air.

12. The method of drying a circuit board material according to claim 11, wherein said dry air is passed through at least one of an air cleaner and a dehumidifier.

13. The method of drying a circuit board material according to claim 1, wherein said predefined pressure is at most 200 Pa.

14. A method of manufacturing a circuit board comprising the steps of:

bonding a film shape material to at least one surface of a substrate material to form a board material with a film;

forming one of a through hole and a blind hole by irradiating said board material with a film with a laser;

cleaning said board material to remove at least one of altered parts and altered substances formed on an inner wall of one of said through hole and said blind hole, and to remove foreign substance adhering to a surface of said board material with a film;

blowing gas onto the surface of said board material with a film to remove water drops adhering to said surface;

drying moisture adhering to and absorbed in said board material with a film, using a method of drying; and forming an electrical connection means in one of said through hole and said blind hole, said method of drying comprising the steps of:

evacuating air in a vacuum chamber containing said board material under an atmospheric pressure to a predefined pressure; and supplying air to said vacuum chamber to return the pressure in said chamber to the atmospheric pressure, wherein said evacuating and supplying steps are performed more than once, and the predefined pressure of a subsequent evacuating step is lower than the predefined pressure of the previous evacuating step.

15. The method of manufacturing a circuit board according to claim 14, wherein said substrate material comprises a prepregnated material, said prepregnated material being made by impregnating a reinforcing material with a thermosetting resin and making the resin into B stage.

16. The method of manufacturing a circuit board according to claim 15, wherein said reinforcing material is one of a glass fiber fabric and a glass fiber non-woven fabric.

17. The method of manufacturing a circuit board according to claim 15, wherein said reinforcing material is one of an aromatic polyamide fiber fabric and an aromatic polyamide fiber non-woven fabric.

18. The method of manufacturing a circuit board according to claim 14, wherein said forming an electrical connection means is a method of filling said hole with paste containing conductive particles.

19. The method of manufacturing a circuit board according to claim 14, wherein forming an electrical connection means is a method of forming a plating layer on an inner wall of said hole.

20. The method of manufacturing a circuit board according to claim 14, wherein one of said board material and said circuit board is dried under a state of stacking sheets of one of said board material and said circuit board one on top of another.

21. The method of manufacturing a circuit board according to claim 14, wherein said film-shape material is coated with a thermosetting epoxy resin on a surface thereof.

22. A method of manufacturing a circuit board comprising the steps of:

bonding a film-shape material to at least one surface of a substrate material to form a board material with a film;

forming one of a through hole and a blind hole by irradiating said board material with a film with a laser;

filling one of said through hole and said blind hole with conductive paste;

drying a double-sided circuit board having circuit patterns on both surfaces thereof, using a method of drying; and laminating said double-sided circuit board and said board material to form a multi-layer circuit board, said board material being filled with said conductive paste and said film-shape materials on the both sides of said board material being peeled off, said method of drying comprising the steps of:

evacuating air in a vacuum chamber containing said circuit board under an atmospheric pressure to a predefined pressure; and supplying air to said vacuum chamber to return the pressure in said chamber to the atmospheric pressure, wherein said evacuating and supplying steps are performed more than once, and the predefined pressure of a subsequent evacuating step is lower than the predefined pressure of the previous evacuating step.

23. A method of manufacturing a circuit board comprising the steps of:

removing moisture from a circuit board having a circuit pattern on at least one surface thereof;

bonding a board material to at least one surface of said circuit board;

laminating said circuit board and said board material by further bonding a metal foil on said board material, and heating and pressing said circuit board and said board material at the same time; and forming a means for electrically connecting said circuit board and said metal foil, wherein moisture contained in said circuit board is removed using a method of drying, said method of drying comprising the steps of:

evacuating air in a vacuum chamber containing said circuit board under an atmospheric pressure to a predefined pressure; and supplying air to said vacuum chamber to return the pressure in said chamber to the atmospheric pressure, wherein said evacuating and supplying steps are performed more than once, and the predefined pressure of a subsequent evacuating step is lower than the predefined pressure of the previous evacuating step.

* * * * *